(12) United States Patent
Kawakami (10) Patent No.: US 7,948,291 B2
(45) Date of Patent: May 24, 2011

(54) LOGIC CIRCUIT

(75) Inventor: Haruo Kawakami, Kanagawa (JP)

(73) Assignee: Fuji Electric Holdings Co., Ltd., Kawasaki (JP)

( * ) Notice: Subject to any disclaimer, the term of this patent is extended or adjusted under 35 U.S.C. 154(b) by 483 days.

(21) Appl. No.: 11/661,132

(22) PCT Filed: Aug. 27, 2004

(86) PCT No.: PCT/JP2004/012370
§ 371 (c)(1),
(2), (4) Date: Jun. 13, 2008

(87) PCT Pub. No.: WO2006/022017
PCT Pub. Date: Mar. 2, 2006

(65) Prior Publication Data
US 2008/0258136 A1 Oct. 23, 2008

(51) Int. Cl.
*H03K 3/02* (2006.01)
*H03K 3/33* (2006.01)
*H03K 3/00* (2006.01)

(52) U.S. Cl. ........ 327/217; 327/185; 327/192; 327/195; 327/197

(58) Field of Classification Search .................. 327/217, 327/185, 188, 189, 192, 195–197
See application file for complete search history.

(56) References Cited

U.S. PATENT DOCUMENTS

| | | | | |
|---|---|---|---|---|
| 3,122,649 A | * | 2/1964 | Roop | 327/195 |
| 3,142,767 A | * | 7/1964 | Cornish | 327/195 |
| 3,239,695 A | * | 3/1966 | Neff et al. | 327/195 |
| 3,271,583 A | * | 9/1966 | Okada | 327/195 |
| 3,359,427 A | * | 12/1967 | Miller et al. | 327/195 |
| 4,985,621 A | | 1/1991 | Aull et al. | |
| 5,170,238 A | | 12/1992 | Sakai et al. | |
| 5,313,117 A | * | 5/1994 | Maezawa | 326/134 |
| 5,625,199 A | | 4/1997 | Baumbach et al. | |
| 6,136,702 A | | 10/2000 | Chandross et al. | |
| 6,239,638 B1 | * | 5/2001 | Masuda | 327/199 |
| 6,284,562 B1 | | 9/2001 | Batlogg et al. | |
| 6,452,207 B1 | | 9/2002 | Bao | |
| 7,573,310 B2 | * | 8/2009 | Yang et al. | 327/195 |
| 2004/0027849 A1 | | 2/2004 | Yang et al. | |

FOREIGN PATENT DOCUMENTS

| | | |
|---|---|---|
| EP | 0268370 A3 | 5/1988 |
| JP | 1-214078 | 8/1989 |
| JP | 9-199732 | 7/1997 |
| JP | 2001-177109 A | 6/2001 |
| JP | 2001-203364 A | 7/2001 |
| JP | 2002-324931 A | 11/2002 |
| JP | 2004-513513 A | 4/2004 |
| WO | WO-02/37500 A1 | 5/2002 |

\* cited by examiner

*Primary Examiner* — Tuan Lam
(74) *Attorney, Agent, or Firm* — Rabin & Berdo, PC

(57) ABSTRACT

The invention includes a two terminal switching device having two stable resistivity values for each applied voltage, which when a voltage of not more than a first threshold voltage (Vth1) is applied, becomes in a first state having a higher resistivity, whereas when a larger second threshold voltage (Vth2) or more is applied, becomes in a second state having a lower resistivity; a resistance connected in series to the switching device; a terminal for applying a bias voltage (Vt) to both ends of a series circuit of the switching device and the resistance; a first pulse inputting terminal; and a second pulse inputting terminal. The invention provides a simple realization of a flip-flop circuit for a sequential logic circuit.

4 Claims, 5 Drawing Sheets

LOGIC CIRCUIT

TECHNICAL FIELD

The present invention relates to a logic circuit using a two terminal switching device having two stable resistivity values against an applied voltage.

BACKGROUND ART

In recent years, the development of characteristics of an electronic device using an organic electronic material has been remarkable. For example, in organic EL displays or organic LED displays, since each pixel individually emits light (or more specifically, spontaneously emits light), they have a number of advantages, such as an advantage that they have a wide viewing angle that a color filter is not necessary; an advantage that a backlight is not necessary so that thinning is possible; and an advantage that they can be formed on a flexible substrate such as plastic, as compared with conventional liquid crystals.

Also, in a circuit system for driving an electronic device of this kind, the use of an organic material is studied. If this is possible, it is expected that an electronic device in which a substrate can be deformed, such as a wearable PC and a flexible display, is realized.

In addition, in RFID (radio frequency identification) technology, which has been eagerly utilized in recent years, the utilization of an organic electronic device is studied. In this RFID technology, data is stored or read out in a medium in a card form or tag form by using a radio wave, and the foregoing data is recognized by communication via an antenna. That is, the data is exchanged by radio between a small-sized medium such as a tag and a device designated as a reader.

Since RFID is convenient in that it is not necessary to bring the tag or the like into contact with the reader if they are in communication range, its application tends to spread. However, since the unit price of a current tag is several tens of yen or more, a problem arises in that it is too expensive to attach to a commodity with a low price.

At present, while IC using a silicon chip is used in a tag, for the purpose of solving the foregoing problem, the use of a tag made of an organic electronic device is studied.

As one example of the foregoing organic electronic device, a CMOS circuit that is configured to have a transistor made of an organic electronic material is proposed. This can be suitably used as a so-called "combination logic circuit" (see, for example, JP 09-199732 A, JP 2001-177109 A, JP 2001-203364 A or JP 2002-324931 A).

The foregoing organic electronic material is formed as a thin film on a substrate. This thin film made of an organic electronic material is formed so as to have a film thickness in the range of from approximately several tens to several hundreds nm by a measure such as vacuum vapor deposition and solution coating (for example, a spin coating method and an inkjet method).

Glass, silicon, and plastics are frequently used as the material of the foregoing substrate. On this substrate, a metal electrode, an electrode made of an oxide such as ITO, an insulating film, and so on are formed by employing a measure such as vacuum vapor deposition, solution coating (for example, a spin coating method and an inkjet method), sputtering, CVD, and PVD as the need arises.

In the foregoing, in particular, the use of an organic material as the electronic material brings such merits that the manufacturing costs are low; that the processing temperature is low; and that flexible electric appliances can be manufactured by using a plastic substrate.

DISCLOSURE OF THE INVENTION

However, a concrete proposal has not yet been made to configure a flip-flop circuit (bistable circuit), which is necessary for a "sequential logic circuit", as opposed to a "combination logic circuit", by using an organic electronic material device. Here, in the "combination logic circuit", an output value is determined by a combination of input logic values at the present point in time; and in the "sequential logic circuit", an output value is determined by a time series of input logic values to the present point in time.

Generally, when using conventional silicon devices, a sequential logic circuit made of a combination of plural transistors and rectifying devices is employed. However, in sequential logic circuits using silicon devices, preparing an organic transistor is complicated. Thus, a problem has arisen that characteristics are so widely scattered that the yield rate is low.

Now, under the foregoing circumstances, an object of the invention is to realize a logic circuit employing an organic electronic material in a simple and easy configuration of a flip-flop circuit (bistable circuit), which is necessary for the "sequential logic circuit".

In order to attain the foregoing object, a logic circuit according to the invention includes a two terminal switching device having two stable resistivity values against each applied voltage value, which when a voltage of not more than a prescribed first threshold voltage is applied thereto, becomes in a first state having a higher resistivity value of the foregoing respective resistivity values, whereas when a voltage of a prescribed second threshold voltage or more that is larger than the foregoing first threshold voltage is applied thereto, becomes in a second state having a lower resistivity value of the foregoing respective resistivity values; a resistance device connected in series to the foregoing two terminal switching device; a terminal for applying a prescribed bias voltage to both ends of a series circuit of the foregoing switching device and resistance device; a first pulse inputting terminal for inputting a first pulse of a prescribed voltage to one end of the foregoing switching device; and a second pulse inputting terminal for inputting a second pulse of a prescribed voltage to a connection between the other end of the foregoing switching device and the foregoing resistance device, with the foregoing first and second states being selectively generated in the foregoing switching device by a combination of inputs of the foregoing first and second pulses.

In one embodiment, the foregoing switching device is configured to have a lower electrode layer and an upper electrode layer each of which is made of a thin film and an organic bistable layer, which is made of a thin film mediated between the foregoing lower electrode layer and upper electrode layer.

In this case, for example, aluminum can be used as a material of the foregoing lower electrode layer and upper electrode layer, and aminoimidazole dicyanate can be used as a material of the foregoing organic bistable layer.

As a concrete example, the foregoing lower electrode layer and upper electrode layer are formed such that they are each in a stripe form and that their longitudinal axial lines are orthogonal to each other; and the foregoing organic bistable layer is formed so as to cover an intersection point between the foregoing lower electrode layer and upper electrode layer.

Also, a logic circuit according to the invention includes a first two terminal switching device having two stable resistivity values against each applied voltage value, which when a voltage of not more than a prescribed first threshold voltage is applied thereto, becomes in a first state having a higher resistivity value of the foregoing respective resistivity values, whereas when a voltage of a prescribed second threshold voltage or more that is larger than the foregoing first threshold voltage is applied thereto, becomes in a second state having a lower resistivity value of the foregoing respective resistivity values; a second two terminal switching device having electric characteristics the same as in the foregoing first switching device and being connected in series in a direction with uniformpolarity to the foregoing first two terminal switching device; a terminal for applying a prescribed bias voltage to both ends of a series circuit of the foregoing first and second switching devices; a first pulse inputting terminal for inputting a first pulse of a prescribed voltage to one end of the series circuit of the foregoing first and second switching devices; a second pulse inputting terminal for inputting a second pulse of a prescribed voltage to a connection between the foregoing first and second switching devices; and a third pulse inputting terminal for inputting a third pulse of a prescribed voltage to the other end of the series circuit of the foregoing first and second switching devices, with the foregoing first and second states being selectively generated in the foregoing first and second switching devices by a combination of inputs of the foregoing first, second and third pulses.

In addition, a logic circuit according to the invention includes a first two terminal switching device having two stable resistivity values against each applied voltage value, which when a voltage of not more than a prescribed first threshold voltage is applied thereto, becomes in a first state having a higher resistivity value of the foregoing respective resistivity values, whereas when a voltage of a prescribed second threshold voltage or more that is larger than the foregoing first threshold voltage is applied thereto, becomes in a second state having a lower resistivity value of the foregoing respective resistivity values; a second two terminal switching device having electric characteristics the same as in the foregoing first switching device and being connected in series in a direction with uniform polarity to the foregoing first two terminal switching device; a terminal for applying a prescribed bias voltage to both ends of a series circuit of the foregoing first and second switching devices; a first pulse inputting terminal for inputting a first pulse of a prescribed voltage to both ends of the series circuit of the foregoing first and second switching devices; and a second pulse inputting terminal for inputting a second pulse of a prescribed voltage to a connection between the foregoing first and second switching devices, with the foregoing first and second states being selectively generated in the foregoing first and second switching devices by a combination of inputs of the foregoing first and second pulses.

In one embodiment, the foregoing first and second switching devices are each configured to have a lower electrode layer and an upper electrode layer each of which is made of a thin film and an organic bistable layer, which is made of a thin film mediated between the foregoing lower electrode layer and upper electrode layer.

In this case, aluminum can be used as a material of the foregoing lower electrode layer; gold can be used as a material of the foregoing upper electrode layer; and bisquinomethane can be used as a material of the foregoing organic bistable layer.

As a concrete example, the foregoing lower electrode layer and upper electrode layer are formed such that they are each in a stripe form and that their longitudinal axial lines are orthogonal to each other; and the foregoing organic bistable layer is formed so as to cover an intersection point between the foregoing lower electrode layer and upper electrode layer.

According to the invention, since a two terminal switching device having two stable resistivity values against each applied voltage value, which when a voltage of not more than a prescribed first threshold voltage is applied thereto, becomes in a first state having a higher resistivity value of the foregoing respective resistivity values, whereas when a voltage of a prescribed second threshold voltage or more that is larger than the foregoing first threshold voltage is applied thereto, becomes in a second state having a lower resistivity value of the foregoing respective resistivity values is used, it becomes possible to realize a flip-flop circuit (bistable circuit), which is necessary for a sequential logic circuit, by a simple and easy configuration.

Also, according to the invention, by configuring the foregoing two terminal switching device by using an organic electronic material, it becomes possible to more reduce the manufacturing costs and to manufacture flexible electric appliances.

Incidentally, it should not be construed that the two terminal switching device of the invention is limited to one using an organic electronic material. That is, the invention also applies to two terminal switching devices formed of an inorganic electronic material so far as they have the foregoing electric characteristics.

BRIEF DESCRIPTION OF THE DRAWINGS

FIG. 5($a$) shows one example of a pulse inputting circuit; and FIG. 5($b$) shows one example of a waveform of a pulse, which is formed by this inputting circuit.

DETAILED DESCRIPTION

Figure 1:
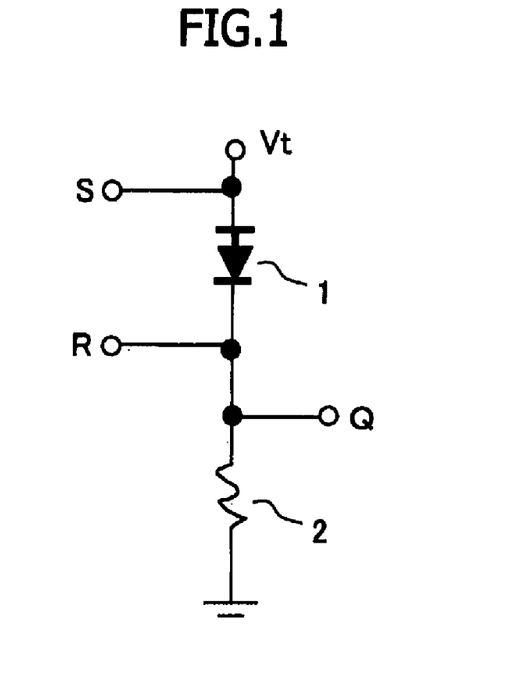
FIG. 1 is a circuit diagram to show a first embodiment of a logic circuit according to the invention.

FIG. 1 shows an embodiment of a logic circuit having the simplest and easiest configuration according to the invention. This logic circuit has a configuration that a resistance 2 is connected in series to a two terminal switching device 1.

Figure 2:
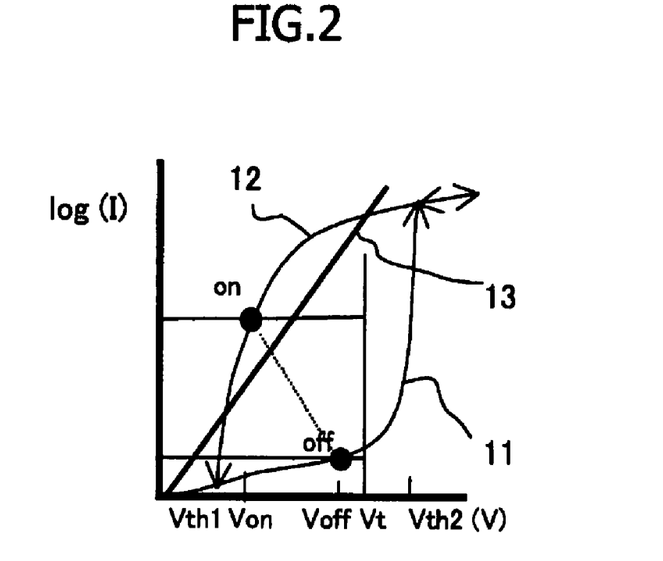
FIG. 2 is a graph to illustrate electric characteristics and operating points of a two terminal switching device, which is used in the logic circuit of FIG. 1.

The foregoing two terminal switching device 1 has electric characteristics (current-voltage characteristics) as illustrated in FIG. 2, namely electric characteristics such that it exhibits two stable resistivity values against each applied voltage value; that when a voltage of not more than a threshold voltage Vth1 is applied, it becomes in a high resistance state (a state to show current-voltage characteristics as illustrated by a reference numeral 11); and that when a voltage of a threshold voltage Vth2 or more is applied, it becomes in a low resistance state (a state to show current-voltage characteristics as illustrated by a reference numeral 12). Incidentally, a reference numeral 13 illustrates electric characteristics of the resistance 2.

In this logic circuit, when a voltage Vt is applied as a direct current bias, two operating points are present corresponding to the foregoing two states of the two terminal switching device 1. In FIG. 2, a voltage of each of the operating points at the time when the two terminal switching device 1 becomes in a low resistance state and in a high resistance state is shown as Von and Voff, respectively.

In the low resistance state, when a pulse of (Von−Vth1) is inputted in a pulse inputting R terminal which is present in a connection between the other end of the two terminal switching device 1 and the resistance 2, the two terminal switching device 1 transits into the high resistance state, whereby a potential of an outputting Q terminal which is present in the foregoing connection changes from (Vt−Von) to (Vt−Voff).

On the other hand, in the high resistance state, when a pulse of (Vth2−Voff) is inputted in a pulse inputting S terminal which is present in one end (application point of direct current bias voltage Vt) of the two terminal switching device 1, the two terminal switching device 1 transits into the low resistance state, and as a result, a potential of the Q terminal changes from (Vt−Voff) to (Vt−Von).

In the case where the both pulses are not inputted, the state of the outputting Q terminal does not change. Furthermore, in the case where the foregoing pulses are inputted in the inputting R and S terminals at the same time, since the both pulses negate each other, the state of the Q terminal does not change, too. Accordingly, when inputs of pulses in the inputting R and S terminals are defined as 1, a non-input is defined as 0, a state value of the current outputting Q terminal is defined as $Q_n$ and a state value of the Q terminal immediately after inputting the pulse is defined as $Q_{n+1}$, a voltage of the Q terminal changes as shown in Table 1 corresponding to a combination of the input and the non-input of the pulses in the R and S terminals.

Incidentally, with respect to the pulses which are inputted in the R and S terminals, pulses having the same height can be used so far as they meet the respective requirements at the same time.

TABLE 1

| S | R | $Q_{n+1}$ | Remark |
|---|---|---|---|
| 0 | 0 | $Q_n$ | Not changed |
| 1 | 0 | Vt − Von | Set |
| 0 | 1 | Vt − Voff | Reset |
| 1 | 1 | $Q_n$ | Not changed |

Now, the flip-flop circuit is classified into an RS (reset/set) flip-flop circuit, a JK flip-flop circuit, a T (trigger) flip-flop circuit, and a D (delay) flip-flop circuit depending upon its function (see, for example, Takeo Miyata, *Sokkai Logic Circuit*, Corona Publishing Co., Ltd. (1998)).

A logical table of the RS flip-flop circuit that is the most basic among them is one as shown in Table 2.

TABLE 2

| S | R | $Q_{n+1}$ | Remark |
|---|---|---|---|
| 0 | 0 | $Q_n$ | Not changed |
| 1 | 0 | 1 | Set |
| 0 | 1 | 0 | Reset |
| 1 | 1 | — | Inhibited |

In the foregoing Table 1, assuming that the time when the value of the outputting Q terminal is (Vt−Von) is defined as a set state and the time when it is (Vt−Voff) is defined as a reset state, it is clear that the logic circuit of FIG. 1 exhibits the operation of Table 2. At this time, an input of S=R=1 is inhibited.

Incidentally, flip-flop circuits of other types can be configured in combination with a device of other kind based on the RS flip-flop circuit (see the foregoing document).

Figure 3:
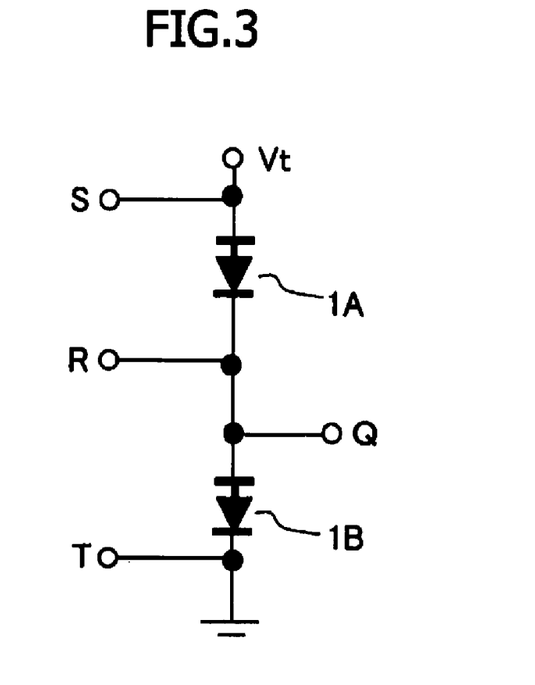
FIG. 3 is a circuit diagram to show a second embodiment of a logic circuit according to the invention.

FIG. 3 shows other embodiment of the logic circuit according to the invention.

The logic circuit as shown in FIG. 3 has a configuration that two terminal switching devices 1A and 1B having the electric characteristics of FIG. 2 are connected in series. Logic when, for example, a direct current bias voltage of Vt=(Vth1+Vth2) is applied to both ends of this logic circuit and a positive pulse of sufficient voltage is selectively inputted in a pulse inputting S terminal which is present in one end (application point of bias voltage Vt) of the two terminal switching device 1A, a pulse inputting R terminal which is present in a series connection between the two terminal switching devices 1A and 1B and a pulse inputting T terminal which is present in a grounding point is one as shown in Table 3. In this Table 3, states 0 and 1 of the switching devices 1A and 1B represent a high resistance state and a low resistance state of those devices, respectively.

TABLE 3

| S | R | T | A | B | $Q_{n+1}$ | Remark |
|---|---|---|---|---|---|---|
| 0 | 0 | 0 | Not changed | Not changed | $Q_n$ | Not changed |
| 0 | 0 | 1 | Not changed | 0 | | |
| 0 | 1 | 0 | 0 | 1 | 1 | Reset |
| 0 | 1 | 1 | 0 | Not changed | | |
| 1 | 0 | 0 | 1 | Not changed | | |
| 1 | 0 | 1 | 1 | 0 | 0 | Set |
| 1 | 1 | 0 | Not changed | 1 | | |
| 1 | 1 | 1 | Not changed | Not changed | $Q_n$ | Not changed |

Now, in the case where the same pulse is inputted in the T terminal and the S terminal as shown in FIG. 3 at the same time, this logic circuit exhibits a logical operation as shown in Table 4. The operation of Table 4 is coincident with the operation of Table 1. This demonstrates that the logic circuit of FIG. 3 has a function as the RS flip-flop circuit, too.

TABLE 4

| S | R | $Q_{n+1}$ | Remark |
|---|---|---|---|
| 0 | 0 | $Q_n$ | Not changed |
| 1 | 0 | Vt − Von | Set |
| 0 | 1 | Vt − Voff | Reset |
| 1 | 1 | $Q_n$ | Not changed |

Figure 4:
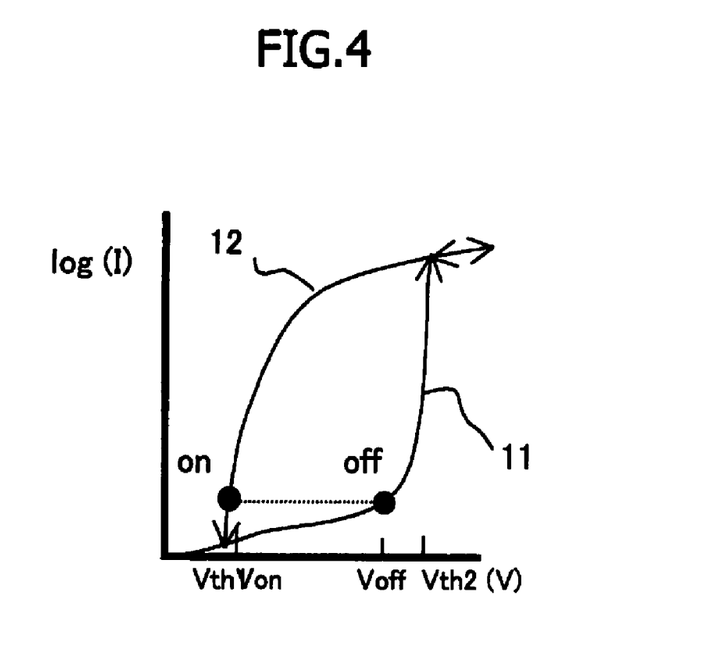
FIG. 4 is a graph to illustrate electric characteristics and operating points of a two terminal switching device, which is used in the logic circuit of FIG. 1.

In the case of this logic circuit, an operating point of the respective switching devices 1A and 1B is one as shown in FIG. 4. As is clear from the comparison between FIG. 2 and FIG. 4, in the case where the same pulse is inputted in the T terminal and the S terminal of the logic circuit as shown in FIG. 3 at the same time, either one of the switching devices 1A and 1B becomes in a high resistance state in all of the set and reset states. Thus, according to this logic circuit, a characteristic feature that a current value is controlled is obtained.

As the two terminal switching devices 1, 1A and 1B related to the invention, a number of devices can be used so far as they have the foregoing functions. For example, there have hitherto been reported Schottky diodes configured of a ferroelectric semiconductor (for example, ZnCdS and SrTiO$_3$ (doped with 0.2% of Cr)) and metal electrodes and two terminal devices resulting from interposing an organic material of every kind (for example, charge transfer complexes containing CuTCNQ, aminoimidazole based materials, and bisquinomethane based materials) by metal electrodes, and these materials are all useful.

Of these, materials using an inorganic material are easy for integration. Furthermore, since materials using an organic material employ a low-temperature process, they are low in costs, and a plastic substrate can be used. In particular, in order to produce cheap IC tags, merits of the latter are large.

Furthermore, with respect to a wiring between the two terminal switching devices 1A and 1B, vapor deposition films with a metal such as aluminum can be used. Furthermore, the foregoing wiring can also be applied by coating or printing of a carbon based conductive material.

As a substrate for forming the switching devices 1, 1A and 1B according to the invention, high molecular weight plastic films such as of polyimides, polyetherimides, polysulfones, polyethersulfones, polyphenylene sulfides, para-type aramids, polyetherketones, polyesters, polycarbonates, amorphous polyolefins, epoxy resins, and fluorine resins can be used as a flexible substrate.

Of these, polyesters or polycarbonates are preferable in view of strength, and polyesters such as polyethylene terephthalate are especially preferable. A thickness of the substrate is preferably from 0.05 mm to 2 mm, and more preferably from 0.1 mm to 1 mm. Furthermore, a non-glass substrate or a silicon substrate can also be used as the flexible substrate.

As a method of forming the organic thin film that configures the two terminal switching devices 1, 1A and 1B, besides vacuum vapor deposition, a coating method can be employed, too. Examples of the coating method include screen printing, casting, and dipping in addition to spin coating and blade coating. Furthermore, there is also enumerated a method in which a thin film is formed by the foregoing appropriate method using a desired low molecular weight precursor or a desired high molecular weight precursor, which is then converted into a desired organic semiconductor layer by a heat treatment or the like.

A coating solution that is used in the foregoing coating method can be prepared by dissolving or dispersing an organic material in a suitable solvent. Though the solvent can be properly selected depending upon the kind of the organic material, for example, THF (tetrahydrofuran) and DCM (dichloromethane) are suitable because they are able to dissolve a number of organic materials therein. Besides, acetonitrile, benzene, butanol, cyclohexane, dichloroethane, ethanol, ethyl acetate, and so on can be used. However, it should not be construed that the solvent is limited thereto.

Figure 5:
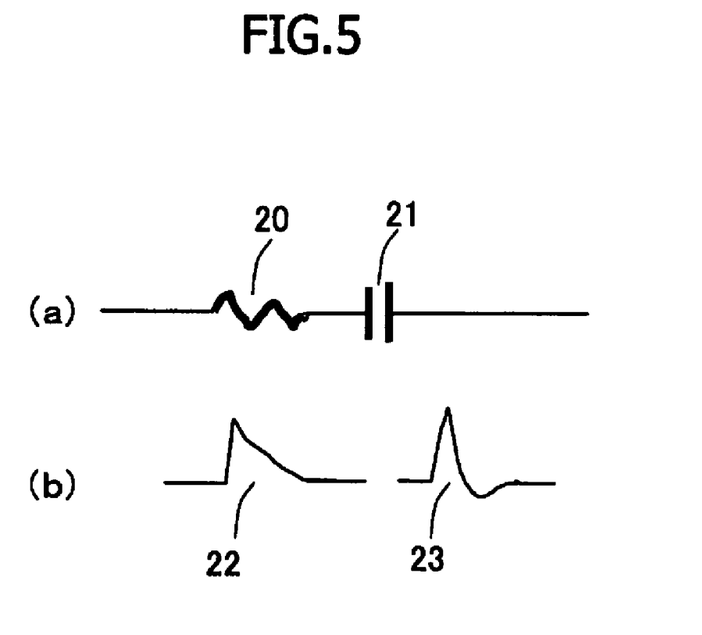

Furthermore, in the foregoing respective embodiments, an inputting pulse is superimposed on the bias voltage Vt, and a number of methods can be employed for this. For example, when a bilaterally asymmetric pulse 22 as shown in a left side of FIG. 5(b) is inputted via a series circuit of a resistance 20 and a capacitor 21 with appropriate capacity as shown in FIG. 5(a), since a displacement current flows in the capacitor 21 corresponding to its asymmetry, it is possible to superimpose a positive or negative pulse 23 as shown in a right side of FIG. 5(b) on the foregoing bias voltage Vt.

Here, the range of the bias voltage Vt is described. The range of the bias voltage Vt is expressed below based on the relations of (Vt=Von+Voff) and (Vth1<Von<Voff<Vth2).

$$2Vth1<(Von+Voff=Vt)<Vth2$$

Though a value of the bias voltage Vt can be properly selected within the foregoing range, in general, it is desired to set up its value as small as possible. This is because the smaller the value of the bias voltage Vt, the smaller the current flowing in the logic circuit, resulting in reducing the consumed electricity.

Examples of the invention will be hereunder described in detail.

EXAMPLE 1

Figure 6:
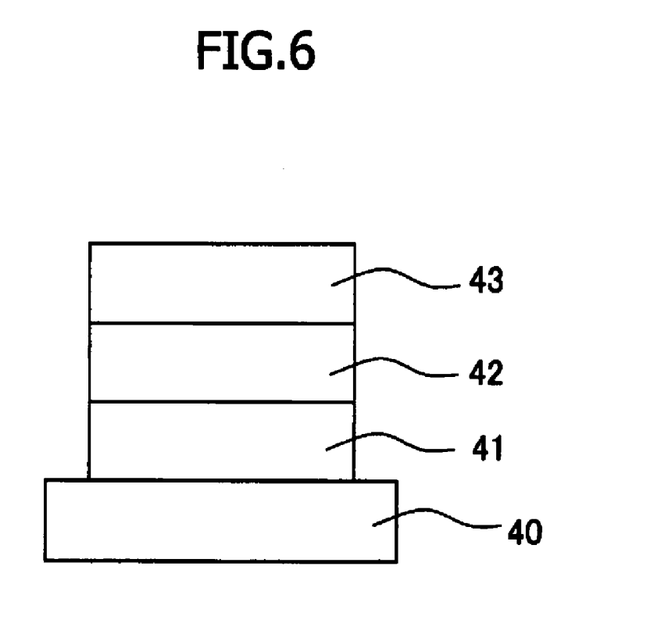
FIG. 6 is a cross-sectional view to conceptually show a configuration of a two terminal switching device according to Examples 1, 2 and 3.

A two terminal switching device having a configuration as shown in FIG. 6 was prepared according to the following procedures.

That is, this switching device is configured by successively forming a lower electrode layer 41, an organic bistable layer 42 and an upper electrode layer 43, each of which is made of a thin film, on a substrate 40 made of glass.

The lower electrode layer 41 was formed by film forming aluminum on a surface of the substrate; the organic bistable layer 42 was formed by film forming aminoimidazole dicyanate represented by the following chemical formula on the lower electrode layer 41; and the upper electrode layer 43 was formed by film forming aluminum on the organic bistable layer 42, respectively.

[Ka 1]

The lower electrode layer 41, the organic bistable layer 42 and the upper electrode layer 43 were film formed so as to have a thickness of about 100 nm, 80 nm and 100 nm, respectively. As a method of this film formation, in the case of employing a vacuum vapor deposition method, a degree of vacuum of a vapor deposition device was set up at approximately 3×10$^{-6}$ torr by exhaustion by a diffusion pump.

The vapor deposition of aluminum was carried out at a film formation rate of 3 angstroms/sec by an ohmic heating system; and the vapor deposition of aminoimidazole dicyanate was carried out at a film formation rate of 2 angstroms/sec by an ohmic heating system. At this time, the lower electrode layer 41 and the upper electrode layer 43 were formed such that they were each in a stripe form with a width of about 0.5 mm and that their longitudinal axial lines were orthogonal to each other; and the organic bistable layer 42 was formed so as to cover an intersection point between the lower electrode layer 41 and the upper electrode layer 43 (see FIG. 7). Accordingly, an effective area of the two terminal switching device according to this Example 1 is about 0.5×0.5=0.25 mm$^2$.

Figure 7:
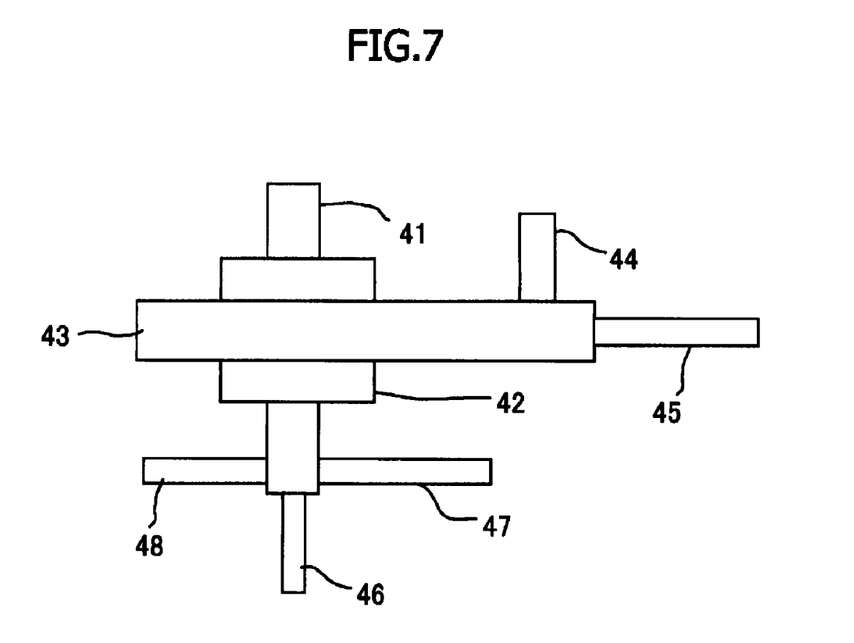
FIG. 7 is a plan view showing a configuration of a logic circuit according to Examples 1 and 2.

Thereafter, a bias applying electrode 44 and a pulse inputting S terminal 45 were connected to the upper electrode layer 43; and a pulse inputting R terminal 46, a resistance terminal 47 and an outputting Q terminal 48 were connected to the lower electrode layer 41. A non-illustrated resistance (corresponding to the resistance 2 of FIG. 1) is connected to the resistance terminal 47. In this resistance, its value is set up at, for example, 0.8 MΩ, and its other end is grounded. There was thus obtained a logic circuit of Example 1. An equivalent circuit to this logic circuit is one as shown in FIG. 1.

EXAMPLE 2

A logic circuit according to this Example 2 is the same as the logic circuit of Example 1, except that a bisquinomethane based compound represented by the following chemical formula was used as the material of the foregoing organic bistable layer 42 and that gold was used as the material of the upper electrode layer 43.

[Ka 2]

EXAMPLE 3

Figure 8:
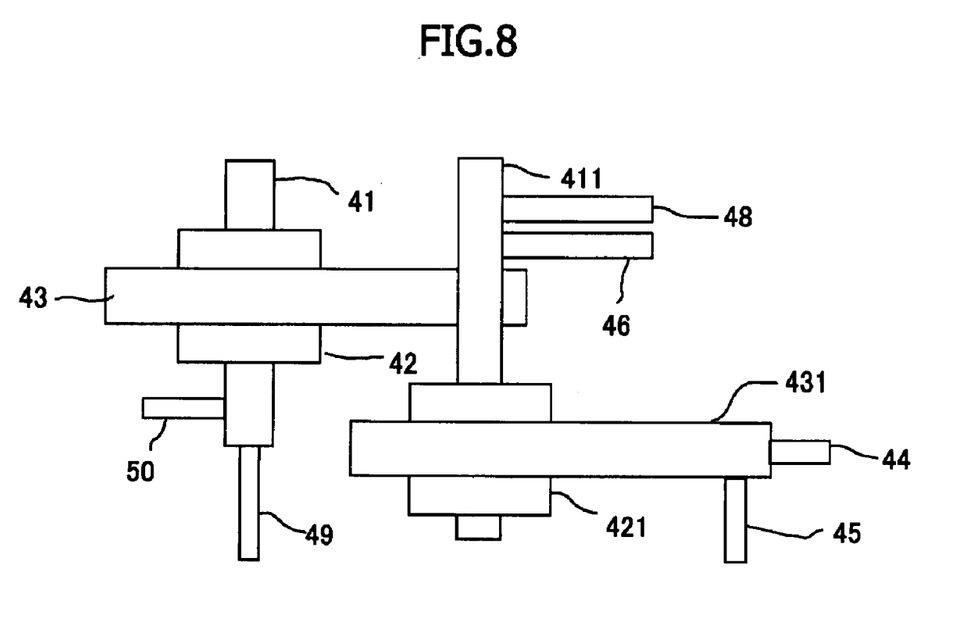
FIG. 8 is a pan view showing a configuration of a logic circuit according to Example 3.

As shown in FIG. 8, a logic circuit according to this Example 3 is provided with two terminal switching devices.

In the respective two terminal switching devices, aluminum is used as a material of each of their lower electrode layers 41 and 411; the foregoing bisquinomethane based compound is used as a material of each of their organic bistable layers 42 and 421; gold is used as a material of each of their upper electrode layers 43 and 431, respectively.

In this Example, first of all, the materials for forming the lower electrode layer 41, the organic bistable layer 42 and the upper electrode layer 43 were successively film formed so as to have a thickness of about 100 nm, 80 nm and 100 nm, respectively, thereby forming a one-sided two terminal switching device.

Thereafter, the lower electrode layer 411 was formed on the upper electrode layer 43 of the foregoing one-sided two terminal switching device (its forming position is deviated towards a right side in FIG. 8 from the position of the lower electrode layer 41 of the one-sided two terminal switching device); and the organic bistable layer 421 and the upper electrode layer 431 corresponding to the foregoing organic bistable layer 42 and the upper electrode layer 43 were further successively formed on this lower electrode layer 411, thereby forming the other two terminal switching device.]

Incidentally, the materials for forming the lower electrode layer 411, the organic bistable layer 421 and the upper electrode layer 431 are also film formed so as to have a thickness of about 100 nm, 80 nm and 100 nm, respectively.

The electrode layers 41 and 43 of the foregoing one-sided two terminal switching device are formed such that they were each in a stripe form with a width of about 0.5 mm and that their longitudinal axial lines are orthogonal to each other; and the electrode layers 411 and 431 of the other two terminal switching device are formed in the same form. Furthermore, the organic bistable layer 42 is formed so as to cover an intersection point between the electrode layers 41 and 43; and similarly, the organic bistable layer 421 is formed so as to cover an intersection point between the electrode layers 411 and 431. Accordingly, an effective area of each of the foregoing two terminal switching devices is about 0.5×0.5=0.25 mm².

After forming the foregoing respective two terminal switching devices, a bias applying electrode 44 and a pulse inputting S terminal 45 were connected to the upper electrode layer 431; a pulse inputting R terminal 46 and an outputting Q terminal 48 were connected to the lower electrode layer 411; and a grounding terminal 50 and a pulse inputting T terminal 49 were connected to the lower electrode layer 41. Incidentally, the grounding terminal 50 is grounded.

An equivalent circuit to the thus formed logic circuit is one as shown in FIG. 3.

TEST EXAMPLE 1

Figure 9:
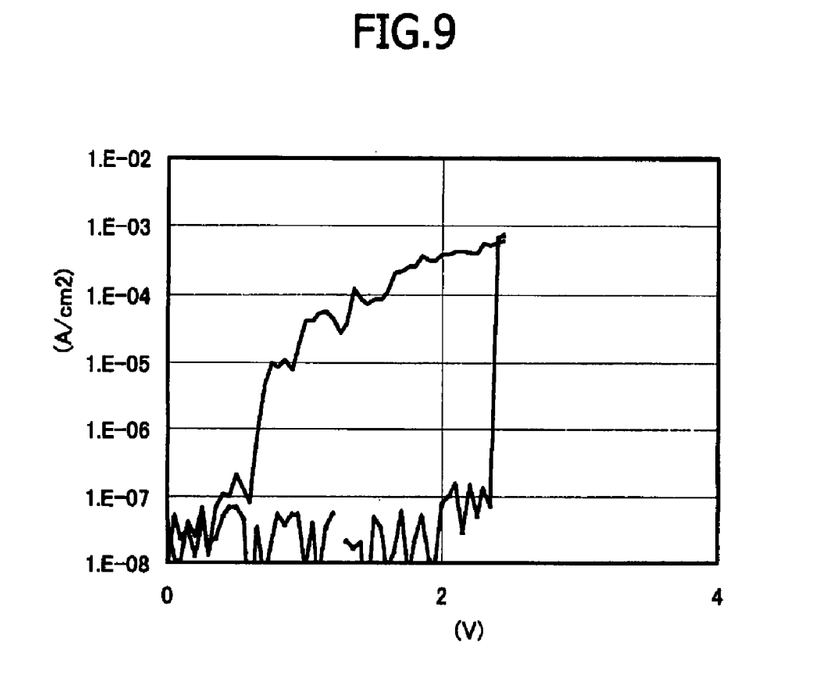
FIG. 9 is a graph showing characteristics of a two terminal switching device in a logic circuit according to Example 1.
Figure 10:
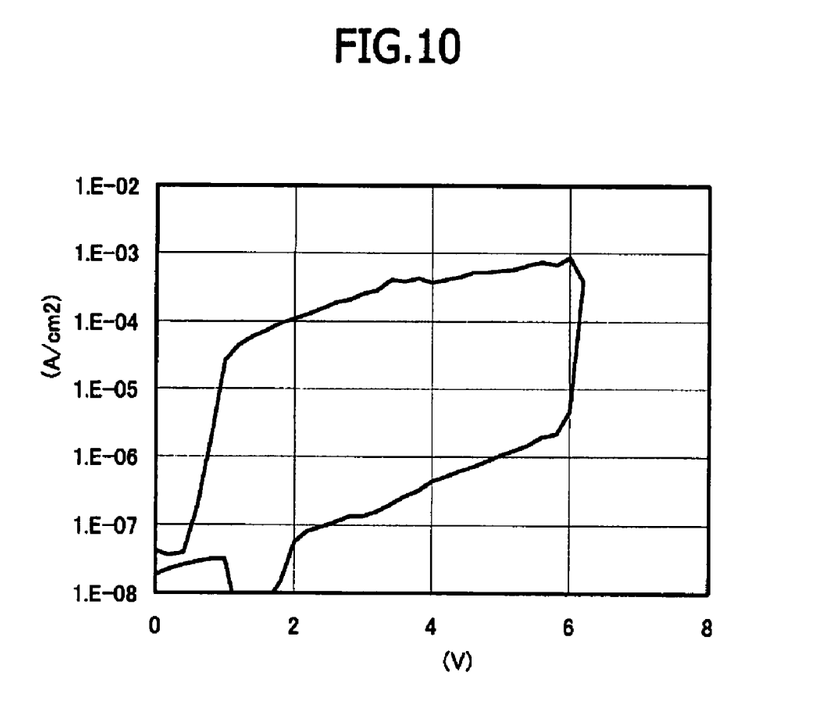
FIG. 10 is a graph showing characteristics of a two terminal switching device in a logic circuit according to Examples 2 and 3.

Characteristics of the switching device 1 as obtained in the foregoing Example 1 were those as shown in FIG. 9; and characteristics of the switching device 1 as obtained in the foregoing Example 2 and characteristics of the respective switching devices as obtained in the foregoing Example 3 were respectively those as shown in FIG. 10. Incidentally, a bias voltage and a pulse input were given from an external circuit.

One example of a drive condition of the logic circuits according to the foregoing Examples 1, 2 and 3 and values of operating point voltages Von and Voff of the respective logic circuits under this condition were summarized in Table 5. As is clear from this Table 5, it was confirmed that all of the logic circuits according to the Examples exhibited a satisfactory operation as an RS flip-flop circuit.

TABLE 5

(unit: V)

| | Vth/1 | Vth2 | Bias voltage | Pulse voltage S | Pulse voltage R | Von | Voff |
|---|---|---|---|---|---|---|---|
| Example 1 | 0.5 | 2.4 | 2.4 | 0.7 | 0.7 | 1.1 | 2.0 |
| Example 2 | 0.5 | 6.0 | 3.0 | 0.7 | 0.7 | 1.5 | 2.5 |
| Example 3 | 0.5 | 6.0 | 3.3 | 1.0 | 1.0 | 0.7 | 5.2 |

In the light of above, while preferred embodiments and examples of the invention have been described, it is evident that the technical scope of the invention is not limited by them.

The invention claimed is:
1. A logic circuit, comprising:
a switching device having two different stable resistivity values for each applied voltage value that is greater than a prescribed first threshold voltage, and is smaller than a prescribed second threshold voltage that is larger than the prescribed first threshold voltage, which when a voltage less than or equal to the prescribed first threshold voltage is applied thereto, becomes in a first state having the higher resistivity value of the two different stable resistivity values, and when a voltage more than or equal to the prescribed second threshold voltage is applied thereto, becomes in a second state having the lower resistivity value of the two different stable resistivity values, the switching device having first and second ends, including:
a lower electrode layer and an upper electrode layer, each of which is made of a thin film, and
an organic bistable layer, which is made of a thin film mediated between the lower electrode layer and the upper electrode layer, wherein the lower electrode layer and the upper electrode layer are formed such that they are each in a stripe form and that their longitudinal axial lines are orthogonal to each other; and the organic bistable layer is formed so as to cover an intersection point between the lower electrode layer and the upper electrode layer;

a resistance device connected to the second end of the switching device to form a series circuit;

a bias terminal for applying a prescribed bias voltage to both ends of the series circuit of the switching device and the resistance device;

a first pulse inputting terminal for inputting a first pulse of a first prescribed voltage to the first end of the switching device;

a second pulse inputting terminal for inputting a second pulse of a second prescribed voltage to a connection between the second end of the switching device and the resistance device, the first and second states being selectively generated in the switching device by a combination of inputs of the first and second pulses; and an output terminal for outputting an output voltage according to the first and second states, wherein the bias terminal and the first pulse inputting terminal are connected to the upper electrode layer, and the output terminal and the second pulse inputting terminal are connected to the lower electrode layer.

2. The logic circuit according to claim 1, wherein the lower electrode layer and the upper electrode layer comprise aluminum; and the organic bistable layer comprises aminoimidazole dicyanate.

3. The logic circuit according to claim 1, wherein the longitudinal axial line of the upper electrode layer is parallel to the longitudinal axial line of the first pulse inputting terminal, and orthogonal to the longitudinal axial line of the bias terminal.

4. The logic circuit according to claim 1, wherein the longitudinal axial line of the lower electrode layer is parallel to the longitudinal axial line of the second pulse inputting terminal, and orthogonal to the longitudinal axial line of the output terminal.

* * * * *